United States Patent
Samukawa et al.

[11] Patent Number: 5,900,699
[45] Date of Patent: May 4, 1999

[54] PLASMA GENERATOR WITH A SHIELD INTERPOSING THE ANTENNA

[75] Inventors: Seiji Samukawa, Tokyo; Tsutomu Tsukada, Chiba; Yukito Nakagawa, Tokyo; Kibatsu Shinohara; Hiroyuki Ueyama, both of Kanagawa, all of Japan

[73] Assignees: Nec Corporation; Anelva Corporation, both of Tokyo; Nihon Koshuha Co., Ltd., Yokohama, all of Japan

[21] Appl. No.: 08/876,902

[22] Filed: Jun. 16, 1997

[30] Foreign Application Priority Data

Jun. 18, 1996 [JP] Japan .................... 8-177361

[51] Int. Cl.⁶ .................................. H05B 37/00
[52] U.S. Cl. .................. 315/111.51; 118/723 I; 313/231.31; 156/345
[58] Field of Search ................... 315/111.21, 111.51; 118/723 I, 723 IR; 313/231.31; 156/345 C

[56] References Cited

U.S. PATENT DOCUMENTS 5,261,962 11/1993 Hamamoto et al. .................. 118/723 I
5,565,738 10/1996 Samukawa et al. ................ 315/111.51

*Primary Examiner*—Robert Pascal
*Assistant Examiner*—Justin P. Bettendorf
*Attorney, Agent, or Firm*—Armstrong, Westerman, Hattori, McLeland & Naughton

[57] ABSTRACT

The plasma generator includes a plasma generation chamber which is pumped and into which plasma generation gas is introduced. An antenna provided outside the plasma generation chamber, a RF source supplying a RF power with the antenna to excite the antenna. A part or whole of the plasma generation chamber is made of dielectric. The antenna radiates the RF through the dielectric and includes an antenna element which longitudinal direction is vertical to the direction for the plasma. The plasma generation chamber has a side wall intersecting the longitudinal direction of the antenna element at both sides. A part or whole of a plasma generation chamber is made of dielectric having relative permittivity $\epsilon_s$. The antenna radiates a RF through the dielectric and is comprised of multiple antenna elements which longitudinal directions are on a plane vertical to the direction for the plasma. A shield is provided at the opposite side of the electric interposing the antenna, and, the electric distance between the antenna and the shield is shorter than the length made from adding $1/\epsilon_s$ times of the thickness of the dielectric with the distance between the dielectric and the antenna. A surface treatment apparatus using the plasma generator, includes a substrate holder for placing a substrate to be treated in parallel with the longitudinal direction of the antenna elements in the plasma generation chamber.

10 Claims, 8 Drawing Sheets

PLASMA GENERATOR WITH A SHIELD INTERPOSING THE ANTENNA

BACKGROUND OF THE INVENTION

1. Field of the Invention

The invention relates to a plasma generator which generates a high-density plasma at low pressure, and a surface treatment apparatus which executes a surface treatment using this plasma generator with a substrate such as a semiconductor wafer.

2. Description of the Related Art

Apparatuses for executing a surface treatment of a substrate such as a semiconductor wafer or liquid crystal display (LCD) substrate using a plasma are well-known as plasma-enhanced chemical vapor deposition (PECVD) apparatuses, and dry etching apparatuses. Among those apparatuses, it is necessary to generate a high-density plasma to obtain higher treatment rates. It is also required to generate high-density plasmas at a lower pressure to prevent contamination of the substrate.

To improve ionizing efficiency in generating a high-density plasma at a lower pressure, helicon wave plasma generators, electron cyclotron resonance (ECR) plasma generators and inductively-coupled type radio-frequency (RF) plasma generators have been developed. As an example of those prior plasma generators, FIG. 10 shows a schematic front view of an inductively-coupled RF plasma generator disclosed in the Japanese unexamined publication No. H3-79025.

The plasma generator shown in FIG. 10 comprises plasma generation chamber 1 having dielectric window 11, RF coil 2 provided outside plasma generation chamber 1 and close to window 11, RF source 3 to supply a RF power with RF coil 2 through matching box 31.

Plasma generation chamber 1 is an air-tight chamber equipped with a pumping system (not shown). Plasma generating gas is introduced into plasma generation chamber 1 by a gas introducing system (not shown). Substrate 40 is held on the upper surface of substrate holder 4 which is provided at the lower side in plasma generation chamber 1. At a plane parallel to substrate 40 RF coil 2 is formed into a spiral having an axis vertical to the plane of substrate 40.

By the RF power supplied from RF source 3 an inductive electric field is applied in plasma generation chamber 1 through dielectric window 11. The plasma generating gas introduced into plasma generation chamber 1 changes into a plasma, forming a discharge by the inductive electric field. This plasma is called "inductively coupled plasma" (ICP) because RF coil 2 and the plasma are inductively coupled through dielectric window 11 when the plasma is generated.

So-called high-density plasma generators, as shown in FIG. 10, can generate a high-density plasma of the $10^{11} cm^{-3}$ at pressures of $10^{-3}$ Torr. However, those high-density plasma generators have a problem in that high-energy electrons, which adversely affect a surface treatment, may be produced simultaneously when high-density plasma is generated.

More specifically, for example, the $SiO_2$/Si selective etch process by plasma etching methods using reaction gas such as $C_4F_8$ has been studied. This selective etch process utilizes a phenomenon in which the etching would be stopped on an Si layer where a carbon polymer film is deposited, while the etching would not be stopped on an $SiO_2$ layer where no polymer film is deposited because oxygen in the layer produces volatile CO, $CO_2$ and $COF_2$.

Through the study of the inventors, it was found that in the $SiO_2$/Si selective etch process the selectivity of $SiO_2$/Si may decrease when the RF energy applied to the plasma increases. The reason for this is that the increased applied energy produces a large number of high-energy electrons, which may excessively dissociate a $C_4F_8$ gas. Though the exact mechanism cannot be described, it is supposed that the Si layer would be etched because the carbon polymer film is deposited involving fluorine chemical species which are activated by the high-energy electrons, or the carbon polymer film is deposited under the existence of active fluorine or fluoride.

In anisotropic etchings, such as a reactive ion etching (RIE) where an electric field is applied vertically to a substrate for acceleration of reactive ions, the substrate is occasionally damaged by high-energy electrons. The high-energy electrons which cause such problems can be produced with high possibility when the high-density plasma generator shown in FIG. 10 is used. This is because the apparatus shown in FIG. 10 uses an RF of several MHz more than 10 MHz such as 13.56 MHz, where there is a high probability of electrons changing their moving directions following the alternating field inducted in plasma generation chamber 1. This is also a result of the low probability of electrons moving to the surface of plasma generation chamber 1 and losing their energy by collision with the surface.

Applying an RF greater than 0 MHz with RF coil 2 enables a reduction in the probability of electrons following the alternating field. But, it is very difficult to excite an RF greater than 100 MHz with RF coil 2 having the spiral shape shown in FIG. 10. Moreover, reducing the probability of electrons following the alternating field, which can restrain the production of high-energy electrons, may make it difficult to generate a high-density plasma, which is the merit of the apparatus.

On the other hand, ECR plasma generators using a microwave can generate a high-density plasma at a low pressure because electrons perform the cyclotron movement because of the effect of a magnetic field. However, the ECR condition requires a high magnetic field strength close to 1000 gauss, which may result in movement caused by the effect of a magnetic field. However, the ECR condition requires a high magnetic field strength close to 1000 gauss, which may cause a problem where a surface treatment loses uniformity by its influence. Charged particles, i.e., ions and electrons transferred along the magnetic lines easily result in a problem of the charge-up damage of the substrate, in which the substrate is damaged through the dielectric film breakdown caused by in-substrate-surface potential differences coming from the non-uniform charge-up because those charged particles may charge up the substrate in accordance with the magnetic profile on the substrate.

Meanwhile, as shown in the Japanese unexamined publication No. H7-307200, a technique of applying an RF in a plasma generation chamber by a radial antenna was proposed recently. In the study of the inventor, it was realized that high-density plasmas with low electron temperature can be generated by applying a RF from 100 MHz to 1 GHz by this type of antenna and this technique can be utilized with high-quality surface treatments without the excessive gas dissociation which may reduce the selectivity of $SiO_2$/Si.

However, problems described below were also found. First of all, in the composition where the antenna is provided in the plasma generation chamber as shown in the JUP No. H7-307200, the antenna is exposed to the plasma, resulting in a problem in that the antenna is sputtered. The sputtered material of the antenna reaches the substrate to cause contamination.

The inventors fabricated the antenna shown in the JUP No. H7-307200 and tried to generate a plasma, applying an RF with some antenna elements composing the radial antenna (for example, two rods 180 degrees apart from each other). Then, it was also found that generating a uniform plasma on a plane parallel to the plane where each antenna element is radially disposed (this plane is hereinafter called "antenna plane") is difficult because the generated plasma tends to be dense at the space beneath the antenna elements where the RF is applied. This tendency dose not change when the number of antenna elements where the RF is applied is increased. Even when the RF is applied with all antenna elements, the plasma tends to be dense at a specific space beneath a specific antenna element.

SUMMARY OF THE INVENTION

The object of the present invention is to solve those problems described above. Specifically, the object of the present invention is to make it possible to generate a high-density and low-electron-temperature plasma without problems such as non-uniformity of treatments and the charge-up substrate damage, to prevent a substrate from contamination by material of a sputtered antenna, and to generate a uniform plasma at a plane parallel to the antenna plane for a surface treatment with high uniformity.

To achieve this object, the present invention provides a plasma generator comprising a plasma generation chamber which is pumped to a pressure and into which plasma generation gas is introduced, an antenna provided outside the plasma generation chamber, an RF source which supplies an RF power of a frequency with the antenna to excite the antenna, wherein a part or whole of the plasma generation chamber is made of dielectric, the antenna radiates the RF to induce the RF field in the plasma generation chamber through the dielectric of the plasma generation chamber. The antenna is comprised of an antenna element which longitudinal direction is vertical to the direction for the plasma in the plasma generation chamber, and the plasma generation chamber has a side wall intersecting the longitudinal direction of the antenna element at both sides.

The present invention also provides a plasma generator comprising a plasma generation chamber which is pumped to a pressure and into which plasma generation gas is introduced, an antenna provided outside the plasma generation chamber, an RF source which supplies an RF power of a frequency with the antenna to excite the antenna, wherein a part or whole of the plasma generation chamber is made of dielectric having relative permittivity $\epsilon_S$. The antenna radiates the RF to induce the RF field in the plasma generation chamber through the dielectric of the plasma generation chamber and is comprised of multiple antenna elements each having longitudinal directions on a plane vertical to the direction for the plasma in the plasma generation chamber. A shield is provided at the opposite side of the dielectric of the plasma generation chamber interposing the antenna, and the electric distance between the antenna and the shield is shorter than the length made from adding $1/\epsilon_S$ times of the thickness of the dielectric of the plasma generation chamber with the distance between the dielectric and the antenna.

The present invention also provides the surface treatment apparatus using the above plasma generator, comprising a substrate holder for placing a substrate in the plasma generation chamber or another chamber communicating with the plasma generation chamber, wherein the substrate holder holds the substrate so that the substrate surface to be treated is parallel to the longitudinal direction of the antenna elements, and the substrate surface is treated utilizing a plasma generated in the plasma generation chamber.

DETAILED DESCRIPTION OF THE PREFERRED EMBODIMENTS

Figure 1:
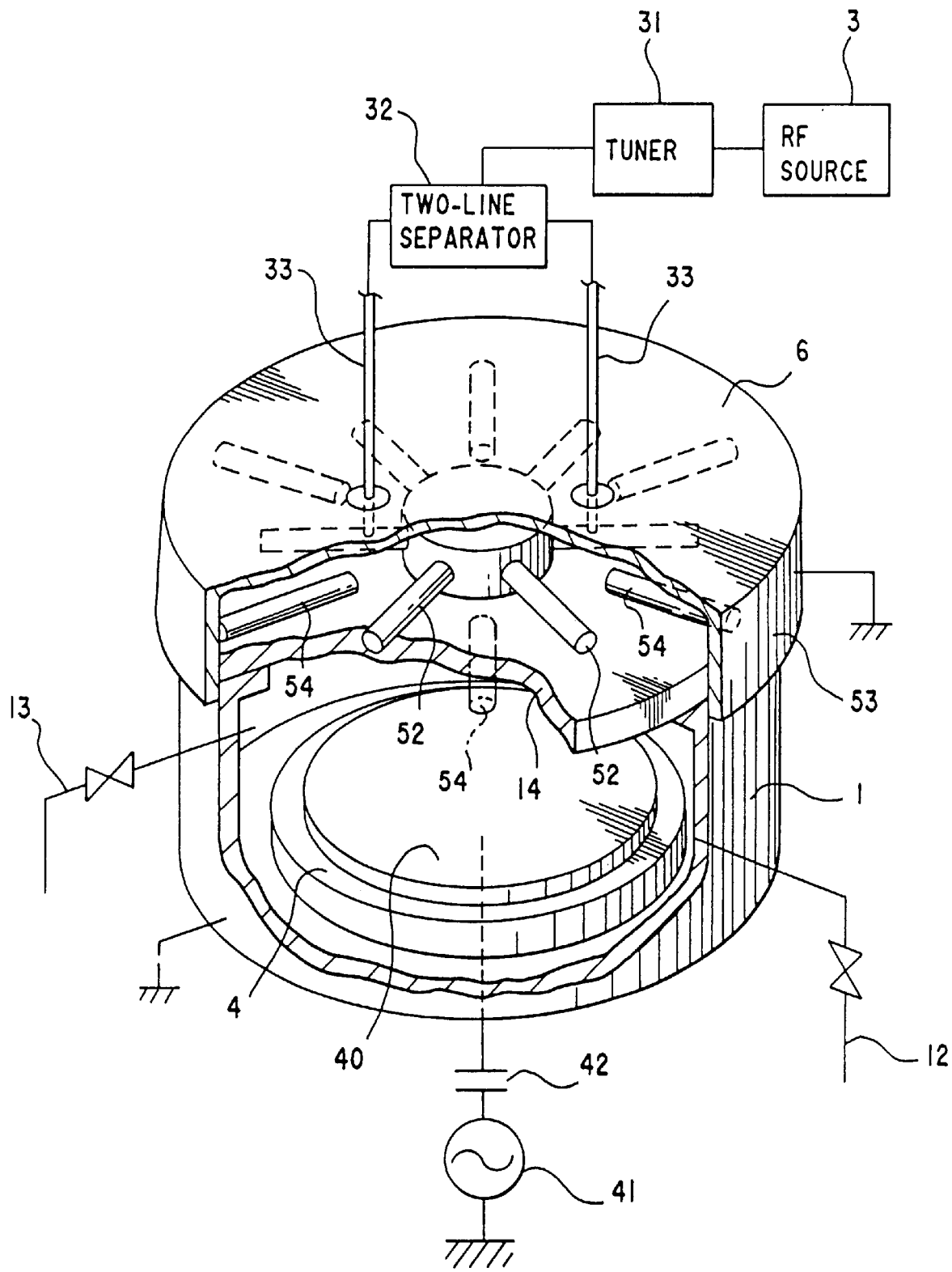
FIG. 1 is a schematic perspective and partially sectional front view of the plasma generator of the first mode of the invention and the surface treatment apparatus of the first embodiment of the invention.
Figure 2:
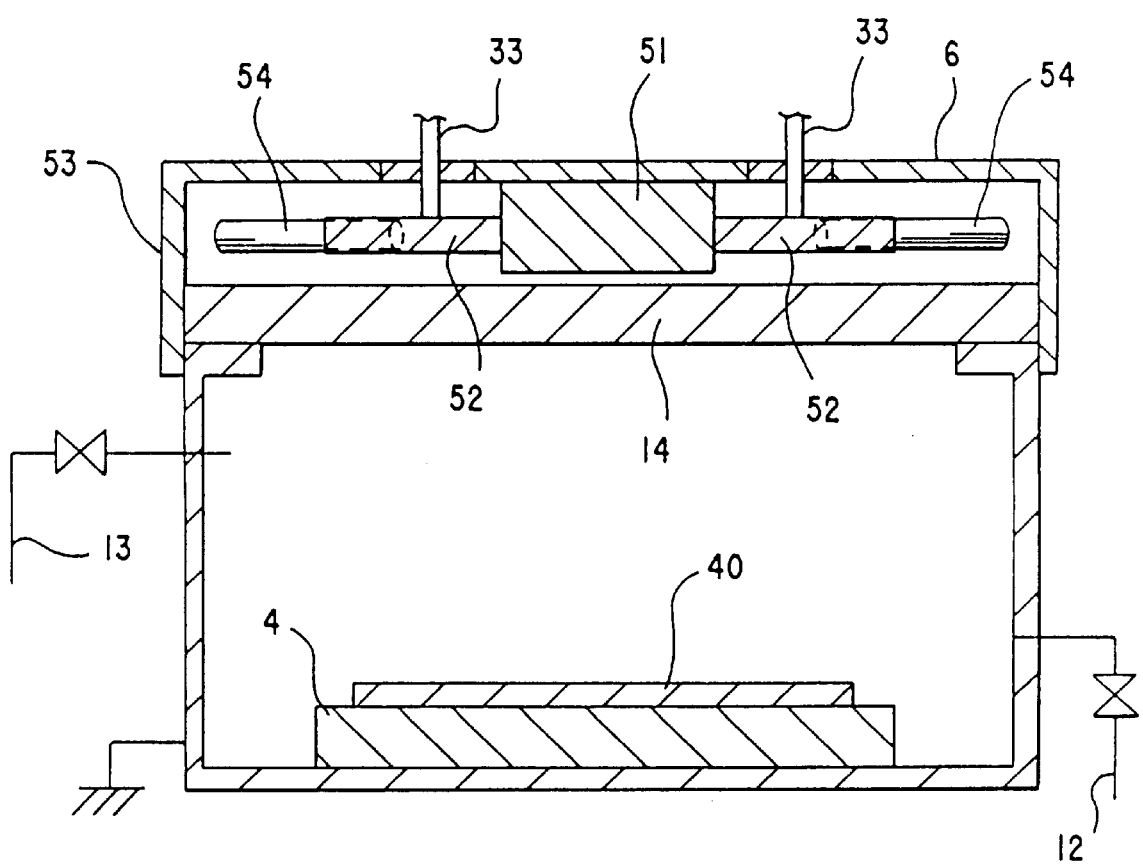
FIG. 2 is a schematic sectional front view of the plasma generator of the first embodiment of the invention and the surface processing apparatus of the mode of the invention.
Figure 3:
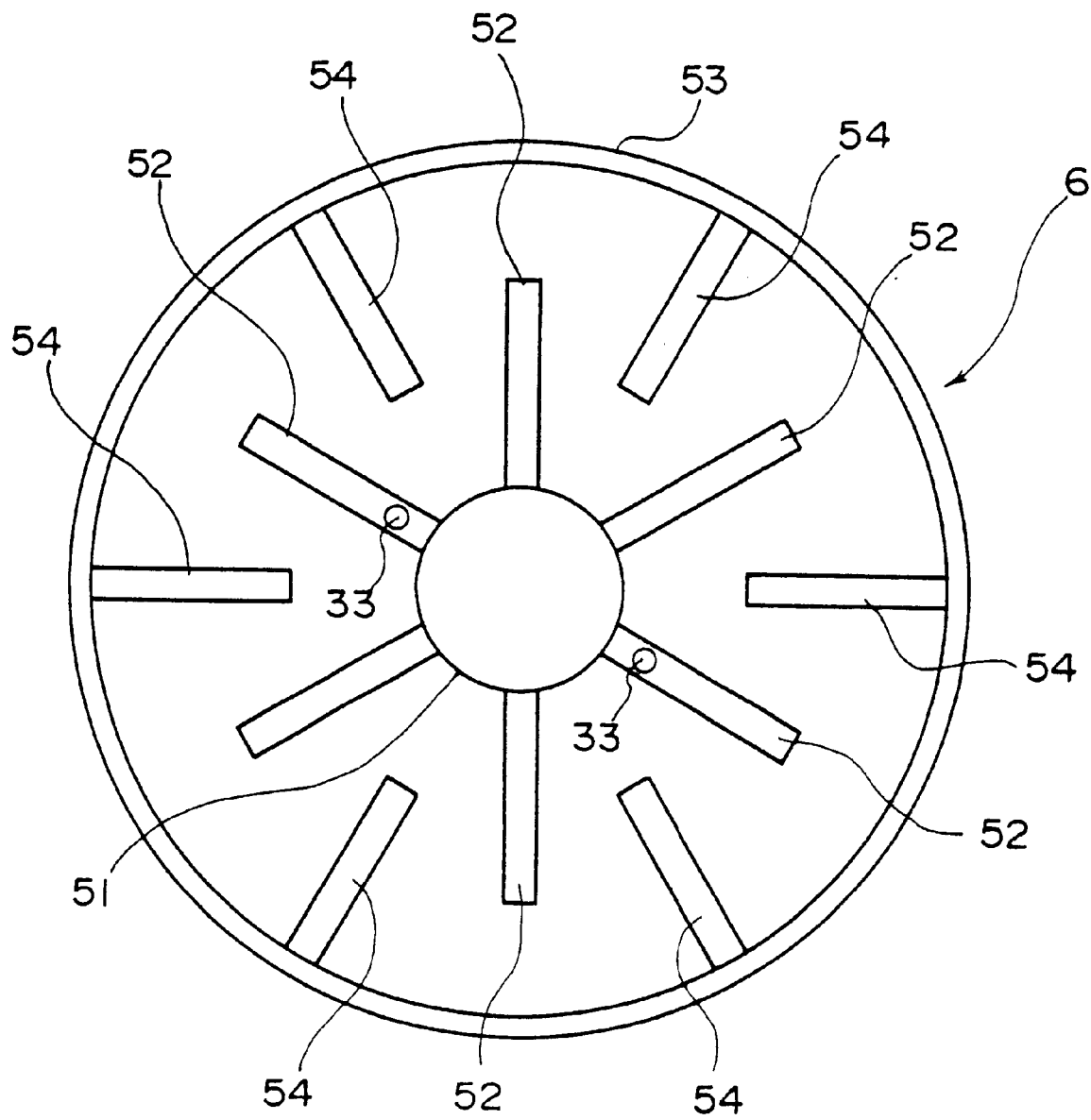
FIG. 3 is a schematic plane view explaining the composition of the antenna used with the first embodiment shown in FIG. 1.

Preferred embodiments of the invention are described as follows. FIG. 1 is a schematic perspective and partially sectional front view of the plasma generator of the first embodiment and the surface treatment apparatus of the mode. FIG. 2 is a schematic sectional front view of the plasma generator of the first mode and the surface treatment apparatus. FIG. 3 is a schematic plane view explaining the composition of the antenna used with the embodiment shown in FIG. 1.

The plasma generator shown in FIG. 1 comprises plasma generation chamber 1 which can be pumped and in which a plasma generating gas is introduced, an antenna provided outside plasma generation chamber 1 and RF source 3 for exciting the antenna by applying a RF power.

Plasma generation chamber 1 is an air-tight vessel which can be pumped to a specific pressure by a pumping system 12. Gas introducing system 13 which can introduce plasma generating gases into plasma generation is chamber 1 also included.

The shape of plasma generation chamber 1 is a cylinder with a closed upper end which is dielectric part 14. In other words, dielectric part 14 is provided so as to shut the upper opening of plasma generation chamber 1. Dielectric part 14 is a board member made of dielectric such as quartz and is connected air-tightly with the side wall of plasma generation chamber 1. Except for dielectric part 14, plasma generation plasma generation chamber 1 is made of a metal such as aluminum.

Shield 6 is provided above plasma generation chamber 1. Shield 6 is cylindrically-shaped having the same diameter as plasma generation chamber 1. The upper end of shield 6 is closed and the lower end of shield 6 is an opening where the upper end of plasma generation chamber 1 is connected. Shield 6 is connected with a grounding device kept at a sufficient ground potential. Plasma generation chamber 1 is also grounded.

The antenna which mainly characterizes this embodiment is composed of antenna elements 52 of the first group which are held by center antenna holder 51 and antenna elements 54 of the second group which are held by outer antenna holder 53.

As shown in FIG. 2, the upper end of center antenna holder 51 is fixed with the upper wall of shield 6 and elongated down in shield 6. Center antenna holder 51 is coaxial with plasma generation chamber 1. Antenna elements 52 of the first group are fixed vertically to center antenna holder 53 and radiate from center antenna holder 53, being apart at the same angle from each other. In this mode, six antenna elements 52 are provided every 60 degrees radially every 60 degrees from center antenna holder 52.

In this embodiment, outer antenna holder 53 is the side wall of shield 6. Antenna elements 54 are held by the side wall of shield 6 and elongated to the center axis of shield 6 which is provided coaxially with plasma generation chamber 1. Each antenna element 54 of the second group is located between every neighboring two antenna elements 52 of the first group.

As shown in FIG. 3, each end of antenna elements 52 of the first group is disconnected with outer antenna holder 53, and, each end of antenna elements 54 of the second group is disconnected with center antenna holder 51. In addition, these antenna elements 52,54 of the first and second group have the resonant electric length at the frequency of the applied RF. Therefore, an inter-digital filter circuit is composed of these antenna elements 52,54. In other words, each of antenna elements 52,54 composes an RF resonator, where the resonating RF is coupled at neighboring every two antenna elements 52,54 and propagated through antenna elements 52,54.

The resonant electric length is described in detail as follows. As is well-known, on an RF circuit with its end disconnected, at the frequency f expressed by formula (1) the reactance is zero where the resonant condition is established, if the loss of the circuit is ignored.

$$f=(2n+1)/\{4l\sqrt{(LC)}\} \quad (1)$$

where n=0,1,2 . . . , l is the length of the circuit, L is inductive reactance of the circuit and C is capacitive reactance of the circuit.

The formula (1) can be changed to:

$$l=(2n+1)/\{4f\sqrt{(LC)}\} \quad (2)$$

So, if antenna elements 52,54 have the length of $(2n+1)/\{4f\sqrt{(LC)}\}$, the RF becomes resonant at the frequency f. This length l is called "resonant electric length". In this length l, L includes the intrinsic inductance of antenna elements 52,54. C includes the floating capacitance $C_1$ between antenna element 52,54 and shield 6, the floating capacitance $C_2$ between antenna element 52,54 and the plasma, and the floating capacitance $C_3$ between neighboring two antenna elements 52,54.

Expressing formula (2) by wavelength λ, because $f=1/\{\lambda\sqrt{(LC)}\}$, the resonant electric length is:

$$l=(2n+1)\lambda/4$$

The practical length of antenna element 52,54 is for the case n=0, that is, the length of λ/4. However, in many cases, lengths other than exactly λ/4 practically present no problem. For example, 60% length of λ/4 may be used. Taking a more specific example in the antenna configuration shown in FIG. 3, the resonant frequency sufficiently corresponds to the frequency of the applied RF, 500 MHz, when the length of antenna elements 52 of the first group is 8 cm and the length of antenna elements 54 of the second group is 12 cm.

As understood from the above description, each antenna element 52,54 is elongated vertically in the direction from the antenna to plasma generation chamber 1, and plasma generation chamber 1 has the side wall intersecting with the longitudinal direction of antenna elements 52,54 at both sides.

Figure 10:
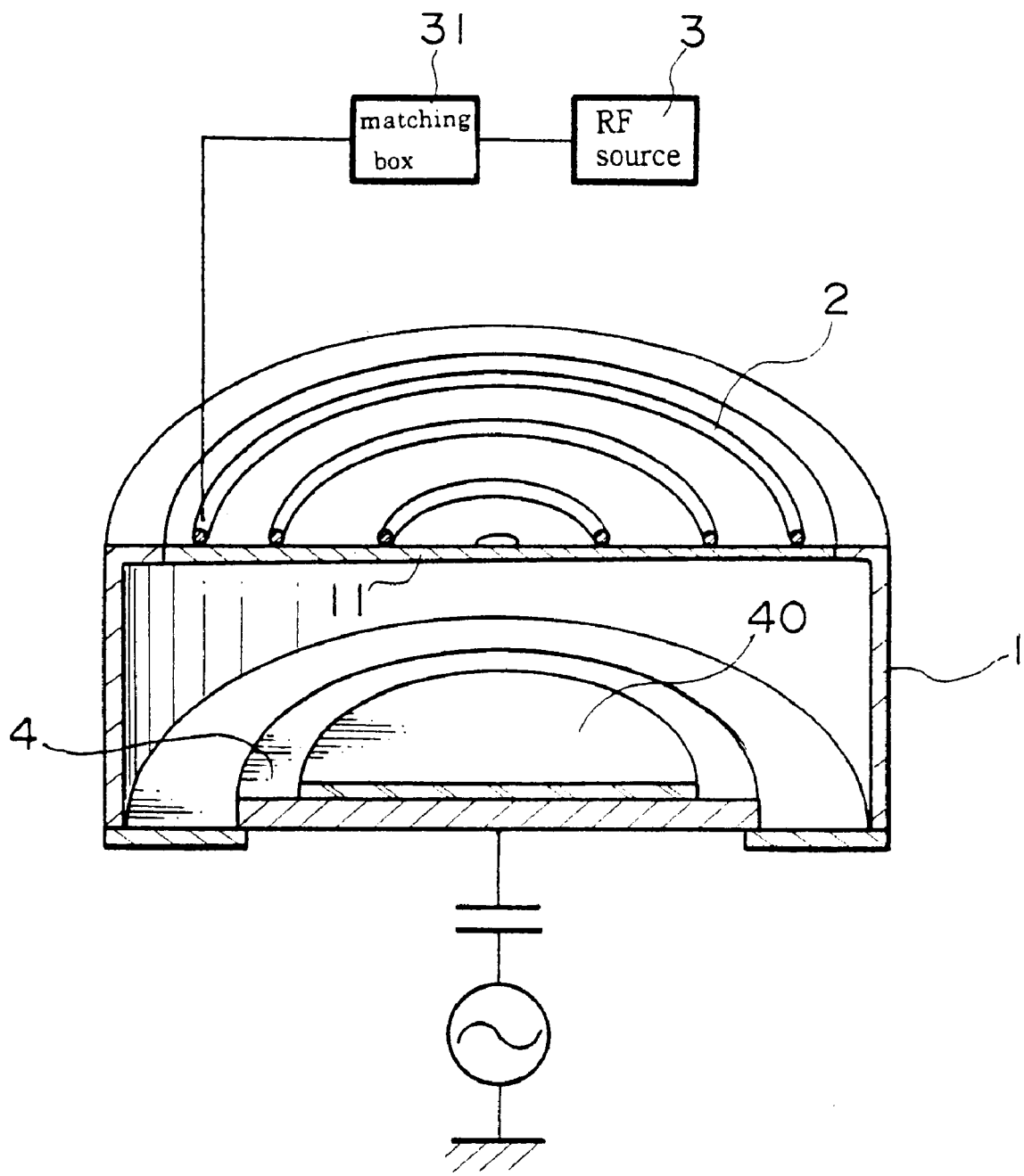
FIG. 10 shows one example of prior art plasma generators.

In this arrangement, the RF which is radiated from each antenna element 52,54 induces an electric field having a component along the longitudinal direction of antenna element 52,54. Electrons tends to move following this field. The antenna in this embodiment, however, is not spirally-shaped such as in the prior art shown in FIG. 10, but radially-shaped where the side wall of plasma generation chamber 1 intersects with the longitudinal direction of each antenna element 52,54. Therefore, there is a high probability of electrons losing their energy by collision with the side wall of plasma generation chamber 1 as a result of following the induced field. This is the reason there is low probability of producing high-energy electrons, which contributes to generation of high-density plasmas with low electron temperature.

Each antenna element 52,54 is a round bar about 10 mm in diameter and made of a metal such as copper. Hollow type bars are sometimes used because antenna elements 52,54 need only have a surface area deeper than the skin depth where the RF current flows.

RF source 3 which supplies the RF power with the antenna of the described composition is connected with the antenna interposing tuner 31 and two-line separator 32. RF source 3 is, in this embodiment, one which output power is 1 kW and oscillation frequency is 500 MHz. Tuner 31 is formed of multiple stubs and coordinates the impedance from tuner 31 down to the load according to the frequency of the RF for the impedance matching. As separator 32, a T-type power divider dividing the power into 1:1 can be used.

The RF lines from separator 32 are connected with two of antenna elements 52 of the first group by coaxial cables 33 penetrating the upper part of shield 6. Antenna elements 52 to which coaxial cables 33 are connected are 180 degrees apart from each other interposing center antenna holder 52. The RF is applied with these two antenna elements 52 at the same phase to excite the entire antenna.

To match the impedance, positions on antenna elements 52 where coaxial cables 33 are connected are determined such that the impedance from coaxial cables 33 to antenna elements 52 can correspond to the characteristic impedance of coaxial cables 33. Insulation blocs are provided where coaxial cables 33 penetrate shield 6 to insulate coaxial cables 33 from shield 6.

Figure 4:
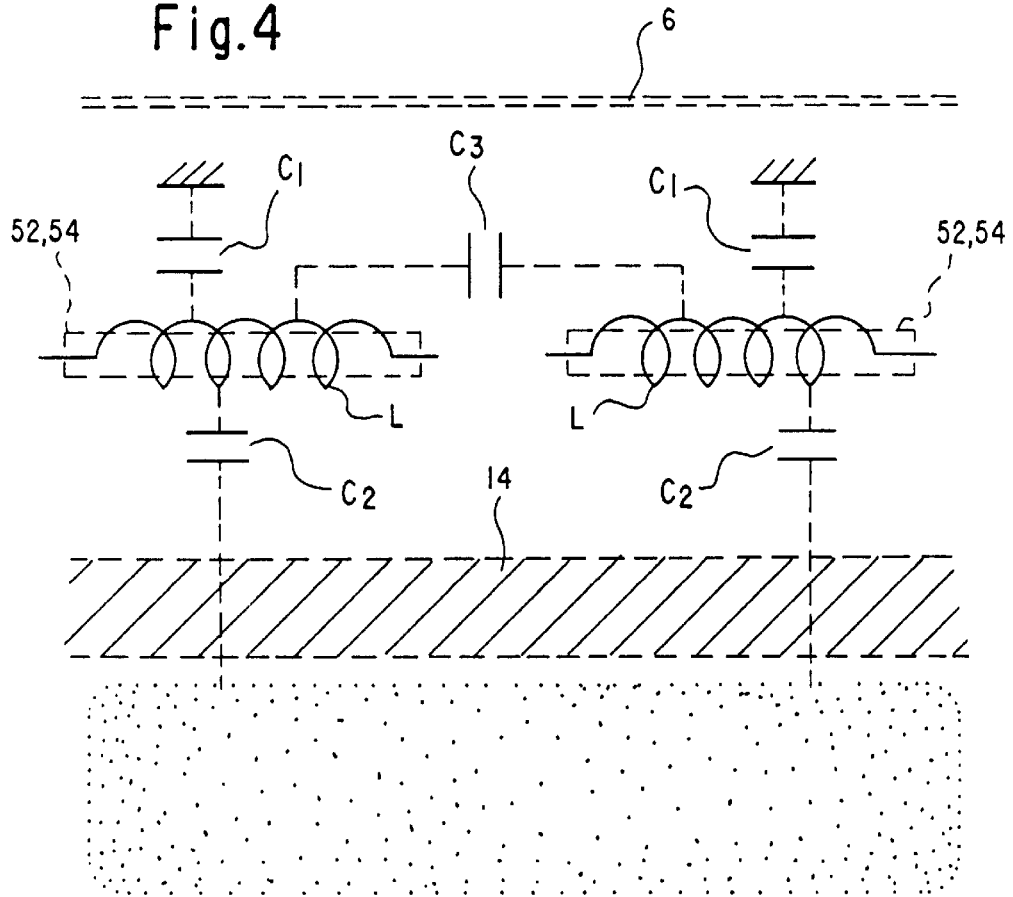
FIG. 4 shows the equivalent circuit of the antenna used with the first embodiment shown in FIG. 1.
Figure 5:
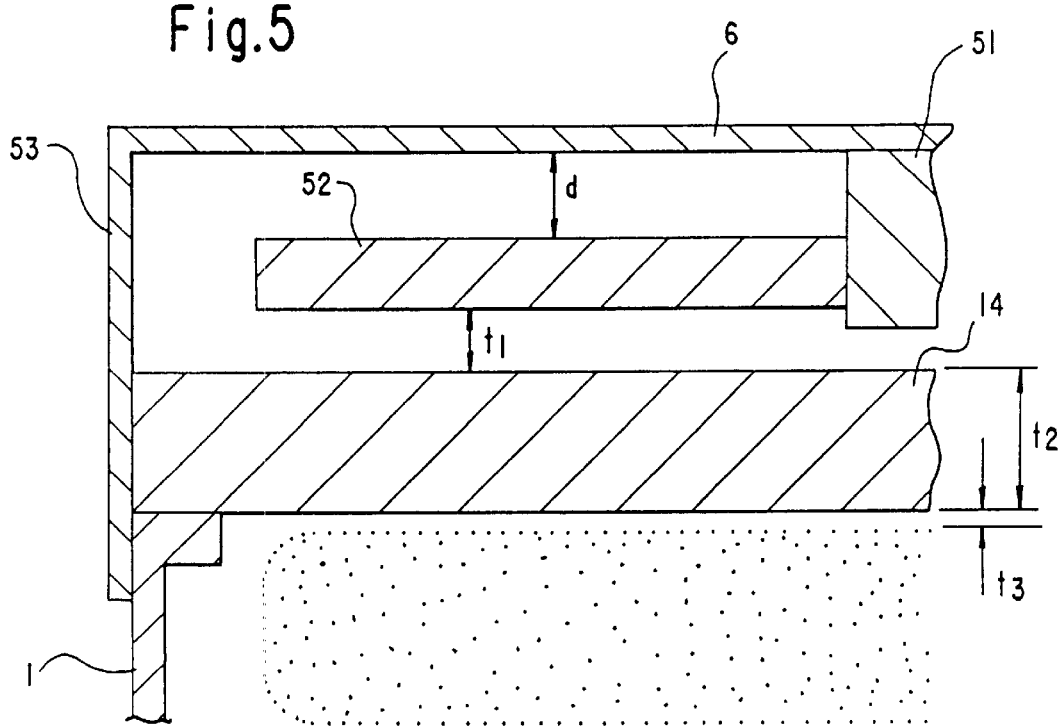
FIG. 5 explains the electric distance around the antenna.

Now, one of major features in the plasma generator of this embodiment is that the fluctuation of the floating capacitance around the antenna minimally affects the RF propagation through the antenna. This point is described in detail as follows. FIG. 4 shows the equivalent circuit of the antenna used with the plasma generator shown in FIG. 1. FIG. 5 explains the electric distance around the antenna shown in FIG. 4.

As shown in FIG. 4, the RF propagation characteristic is characterized by the intrinsic inductance L of antenna elements 52,54, the floating capacitance $C_1$ between antenna element 52,54 and shield 6, the floating capacitance $C_2$ between antenna element 52,54 and the plasma, and the floating capacitance $C_3$ between neighboring two antenna elements 52,54.

In this equivalent circuit, L, $C_1$ and $C_3$ are electrically stable and do not fluctuate. However, $C_2$ may inevitably fluctuate a little as a result of a change in the electric characteristic of the plasma. A plasma inductively coupled with an antenna can be treated as a conductor through which an induced current flows. The impedance fluctuation of the plasma affects the coupling situation of the RF to cause the fluctuation of the floating capacitance $C_2$ between antenna element 52,54 and shield 6. In addition, although the plasma itself may be almost at 0 V potential, the dielectric part 14 is a floating potential, which is a negative potential of several volts on the surface facing the plasma.

By approximation to the parallel plate capacitor, the unit area floating capacitance $C_2$ is calculated as, $$1/C_2 = t_1/\epsilon_0 + t_2/\epsilon + t_3/\epsilon_0$$

$$C_2 = (\epsilon_0\epsilon)/(\epsilon t_1 + \epsilon_0 t_2 + \epsilon t_3) \quad (3)$$

where $t_1$ is the distance between antenna element 52,54 and dielectric part 14, $t_2$ is the thickness of dielectric part 14, $t_3$ is the thickness of the plasma sheath, $\epsilon$ is the permittivity of dielectric part 14, and the permittivity of shield 6 and the plasma sheath is dealt to be equal to the permittivity of vacuum $\epsilon_0$. (See FIG. 5)

In formula (3), thickness $t_3$ is small enough to ignore compared with $t_1$ and $t_2$. Therefore, $$C_2 = (\epsilon_0\epsilon)/(\epsilon t_1 + \epsilon_0 t_2) \quad (4)$$

On the other hand, also by approximation to the parallel plate capacitor, the unit area floating capacitance $C_1$ is calculated as $$C_1 = \epsilon_0/d \quad (5)$$

where d is the distance between antenna element 52, 54 and shield 6.

Dividing the numerator and denominator on the right side of formula (4) by $\epsilon$, $$C_2 = \epsilon_0 / \{t_1 + (\epsilon_0/\epsilon)t_2\} \quad (6)$$

$$= \epsilon_0 / \{t_1 + t_2/\epsilon_S\}$$

where $\epsilon_S$ is the relative permittivity of dielectric part 14.

As realized by comparing formula (5) with formula (6), if $(t_1+t_2/\epsilon_S)>d$, then $C_1>C_2$. In other words, if the length made by adding the distance between antenna element 52,54 and dielectric part 14 with the electric thickness $(t_2/\epsilon_S)$ is greater than the distance between antenna element 52,54 and shield 6, the floating capacitance between antenna element 52,54 and shield 6 is greater than the floating capacitance between antenna element 52,54 and the plasma. Addition of the stable capacitance $C_3$ with $C_1$ also produces a greater value than the unstable floating capacitance $C_2$.

As described, giving the relation $(t_1+t_2/\epsilon_S)>d$ in this embodiment can reduce the influence of the unstable floating capacitance $C_2$ sufficiently. This results in RF propagation through the antenna into plasma generation chamber 1 becoming stable enough to generate the stable plasma in plasma generation chamber 1. Taking a more specific example, it is possible that $t_1=15$ mm, $t_2=30$ mm, $\epsilon_S=4.5$, and, $d=10$ mm.

The described stabilization of the RF propagation especially brings a prominent effect when such an inter-digital filter is used as in this embodiment. This point is described in detail as follows.

With the antenna in this embodiment, where an inter-digital filter is composed, the RF is radiated uniformly from each antenna element 52,54 because the RF is resonant on each antenna element 52,54 at the resonant frequency and inductively coupled between every neighboring two antenna elements 52,54. The resonant frequency is, as described, determined from the intrinsic inductance L of antenna elements 52,54, the floating capacitance $C_1$ between antenna element 52,54 and shield 6, the floating capacitance $C_2$ between antenna element 52,54 and the plasma, and the floating capacitance $C_3$ between neighboring two antenna elements 52,54. Practically speaking, factors such as the geometry and material of antenna elements 52,54, the distance between two neighboring antenna elements 52,54, the distance between antenna element 52,54 and shield 6, the distance between antenna element 52,54 and dielectric part 14, and, relative permittivity $\epsilon_S$ are determined such that the resonant frequency can correspond to the frequency of the RF to apply.

As described, however, if the electric distance between antenna element 52,54 and the plasma is less than the distance between antenna element 52,54 and shield 6, the resonant condition of the inter-digital filter may change resulting in that the resonant frequency deviates from the frequency of the applied RF because the floating capacitance fluctuation caused from the plasma instability greatly affects the resonant condition.

The fluctuation of the resonant frequency with the inter-digital filter causes a problem in that the plasma in plasma generation chamber 1 gets localized because the RF radiated into plasma generation chamber 1 becomes non-uniform. More specifically, when the resonant frequency deviates from the frequency of the applied RF, the RF tends to be excited only at antenna elements 52,54 with which the RF is initially applied because the RF is not coupled with other neighboring antenna elements 52,54. In this case, the strong RF field is induced only at the space in plasma generation chamber 1 just beneath antenna elements 52,54 with which the RF is initially applied, resulting in that the plasma becomes dense only at that space. The RF is easier to be applied at the space where the dense plasma is generated because the impedance of that space goes lower, thereby encouraging plasma localization.

A phenomenon such as plasma localization is caused not only by the temporary fluctuation of the floating capacitance but also by a spatial fluctuation of the electrical characteristic of the plasma along a direction parallel to the antenna plane. Even if the resonant frequency of the inter-digital filter corresponds sufficiently to the frequency of the applied RF so that the RF can be radiated uniformly from each antenna element 52,54 when the RF source is initially operated to generate the plasma, it is difficult to make the electrical characteristic of the plasma uniform at directions parallel to the antenna plane. For example, it is inevitable that the impedance of the plasma gets slightly non-uniform from a slight non-uniformity of the plasma density.

In this case, because the RF current is easier to flow at the place where the impedance is lower, the floating capacitance between that place and the antenna becomes greater than the floating capacitance between another place and the antenna.

In short, the floating capacitance gets non-uniform a plane parallel to the antenna plane. In this case, if the electric distance $(t_1+t_2/\epsilon_S)$ between antenna element 52,54 and the plasma is less than the electric distance d between antenna element 52,54 and shield 6, the fluctuation of the floating capacitance affects the resonant frequency of the inter-digital filter enough to break the resonant condition. Because the floating capacitance becomes greater at the place just beneath one of antenna elements 52,54, the RF coupling between this place and this antenna element 52,54 becomes stronger. As a result of this, the RF can not propagate to other antenna elements 52,54 because the RF coupling with neighboring antenna elements 52,54 becomes weaker.

Moreover, at the place where the floating capacitance is greater, because more of the RF is supplied to increase the plasma density, the impedance decreases furthermore, resulting in that the RF coupling becomes stronger to increase the plasma density furthermore. Then, the plasma gets localized more and more because the initial non-uniformity of the electrical characteristic of the plasma is amplified. This is just the same mechanism as the start of the oscillation produced by the positive feedback.

In the apparatus of this embodiment, to prevent this problem the relation $(t_1+t_2/\epsilon_S)>d$ is given so that the resonant condition of the inter-digital filter cannot be influenced by the unstable floating capacitance $C_2$ between antenna element 52,54 and the plasma. This enables the RF to be radiated uniformly because the resonant frequency of the inter-digital filter changes very little, even if $C_2$ fluctuates or gets out of uniform on a plane parallel to the antenna plane. Therefore, the plasma localization describe above cannot be formed.

Figure 6:
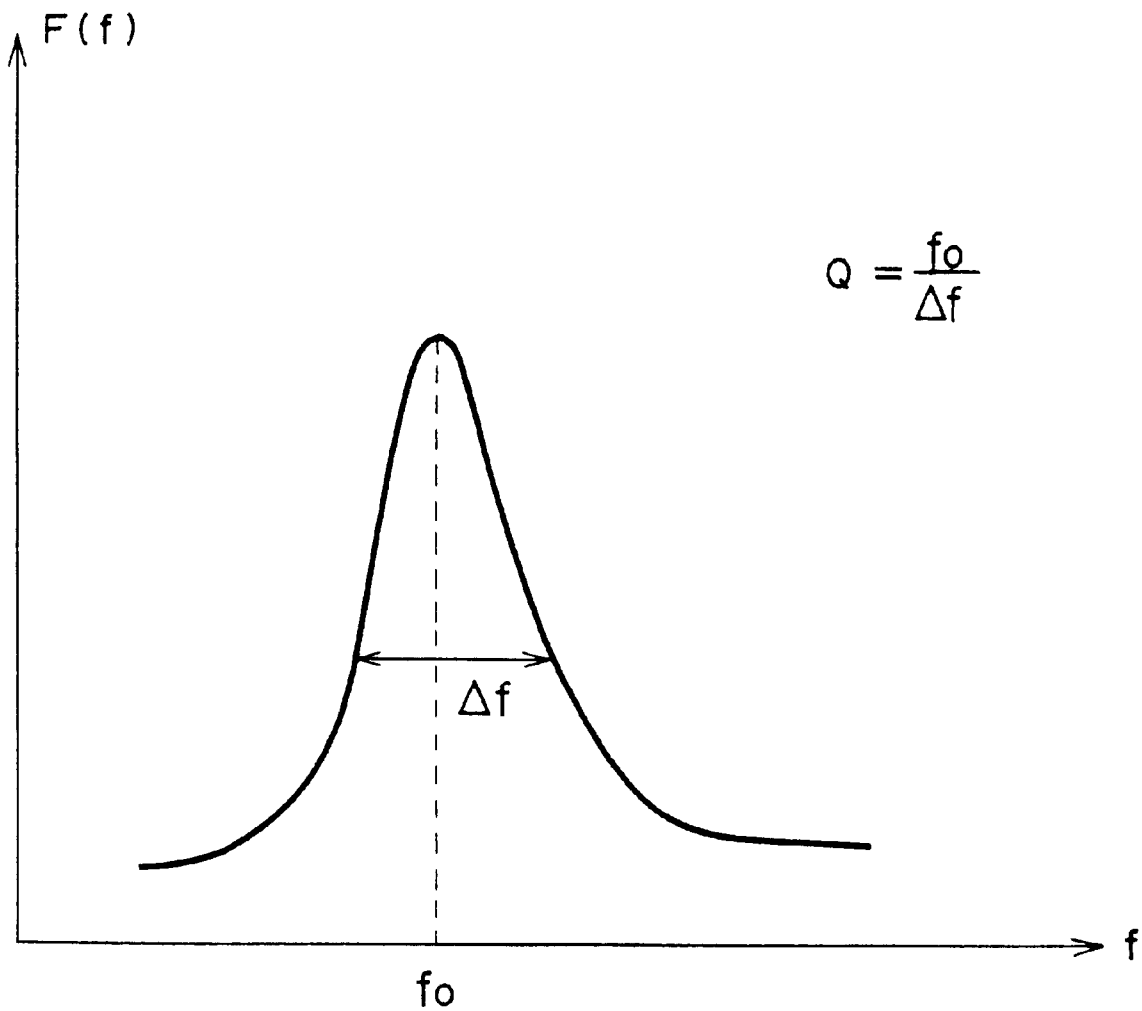
FIG. 6 explains the resonant intensity Q.

The resonant intensity Q is also a significant factor in determining the resonant frequency of the inter-digital filter. FIG. 6 explains the resonant intensity Q. The resonant intensity Q is expressed as;

$Q=f_0/\Delta f$ where fo is the resonant frequency and $\Delta f$ is the half-power bandwidth of the radiated RF energy. Though it is inevitable that the resonant frequency fo varies slightly among antenna elements 52,54 according to factors such as the intrinsic inductance L and the floating capacitance, if the resonant intensity Q is increased, the RF is radiated strongly from one of antenna elements 52,54 where the resonant frequency fo correspond most to the frequency of the applied RF. This can be a cause of non-uniformity of the plasma density. Therefore, the resonant intensity should not be increased so much. Practically, it should be 5 to 50.

Next, a surface treatment apparatus of the embodiment of the invention, which uses the plasma generator having the above composition is described as follows. The surface treatment apparatus of the embodiment comprises the plasma generator of the described embodiment and is composed so as to execute a treatment on the surface of substrate 40 using a plasma generated in plasma generation chamber 1. Specifically, the surface treatment apparatus is composed mainly of the plasma generator and substrate holder 4 which holds substrate 4 in a way such that its surface is parallel to the longitudinal directions of antenna elements 52,54.

Plasma generation chamber 1 comprises a gate valve (not shown) in addition to vacuum system 12 and gas introduction system 13 described before. Substrate bias supply 41 for giving a self-bias voltage with substrate 40 is connected with substrate holder 4 interposing capacitor 42. Capacitor 42 is provided such that substrate is self-biased to be bombarded with ions. Other than these, a heater for heating substrate 40 during a treatment is provided in substrate holder 4 if necessary.

Operations of the plasma generator and the surface treatment apparatus of the above compositions are described as follows. The surface treatment apparatus of the embodiment executes the selective etching of $SiO_2/Si$ and substrate 40 has a $SiO_2$ layer formed on a Si under layer at the substrate surface.

First of all, pumping plasma generation chamber 1 to about $10^{-5}$ Torr by vacuum system 12 and maintaining this pressure, substrate 40 is transferred from a load-lock chamber (not shown) into plasma generation chamber 1 through the gate valve and is placed on substrate holder 4 to be held. $C_4F_8$ gas is introduced into plasma generation chamber 1 by gas introduction system 13 such that the pressure in plasma generation chamber 1 is maintained at about 10 mTorr. Next, an RF power of 600 MHz is applied with the antenna from RF source 3 at the output power of about 1 kW, resulting in radiating the RF from each antenna element 52,54 into plasma generation chamber 1. Then, a high-density plasma of about $10^{11} cm^{-3}$, which means $10^{11}$ electrons per cubic centimeter, is generated in plasma generation chamber 1. Concurrently, a substrate bias voltage is applied with substrate 40 by substrate bias supply 41.

The generated plasma produces active fluorine and active fluorides, which etch $SiO_2$ at the surface of substrate 40. When the etching progresses to remove the entire $SiO_2$ layer, though the Si underlying gets unveiled, the etching stops because a carbon polymer film is deposited on the Si surface.

After the lapse of time necessary for etching the $SiO_2$ layer, the operations of gas introducing system 13, the plasma generator and substrate bias supply 41 are stopped. Then, substrate 40 is transferred out of plasma generation chamber 1 after pumping plasma generation chamber 1 again.

The apparatus of the embodiment operated as described makes it possible to execute the surface treatment of $SiO_2/Si$ selective etch at a high rate because the high-density plasma of $10^{11} cm^{-3}$ is generated. In addition to the generation of this high-density plasma without using a magnetic field, there is a high probability of electrons losing their energy. As a result, they follow the induced electrical field to collide onto the side wall, and the electron temperature of the generated plasma is low. The selectivity of $SiO_2/Si$, therefore, is not decreased. Furthermore, there is no liklihood that substrate 40 is contaminated with the material of the sputtered antenna because the antenna is provided outside plasma generation chamber 1. There is also no liklihood of antenna consumption which could arise if the antenna is sputtered.

The RF propagation into plasma generation chamber 1 through the antenna is so stable that the plasma which is stable temporarily and spatially can be generated in plasma generation chamber 1, because the influence of the unstable floating capacitance $C_2$ between antenna element 52,54 and the plasma is reduced sufficiently by making the electric distance d between antenna element 52,54 and shield 6 shorter than the electric distance $(t_1+t_2/\epsilon_S)$ between antenna element 52,54 and the plasma. This effect is prominent in this embodiment of the invention employing the inter-digital filter composed of the antenna, where the RF is radiated uniformly from each antenna element 52,54 without interfering with the working of the inter-digital filter. A surface treatment of good process property can be executed with good reproducibility utilizing such a temporarily and spatially stable plasma.

The arrangement where substrate 40 is place parallel to the longitudinal directions of antenna elements 52,54 contributes to a highly uniform surface treatment by utilizing the plasma that is uniform at directions parallel to the antenna plane. This also contributes to reducing the probability that electrons following the electric field may collide onto substrate 40 to damage substrate 40.

Figure 7:
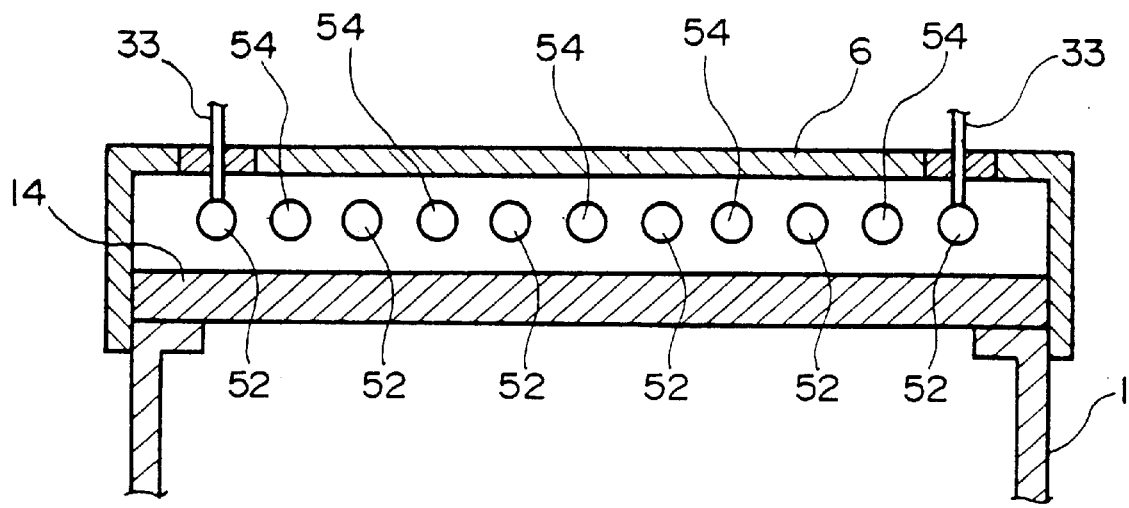
FIG. 7 is a schematic sectional front view of the plasma generator of the second embodiment of the invention.
Figure 8:
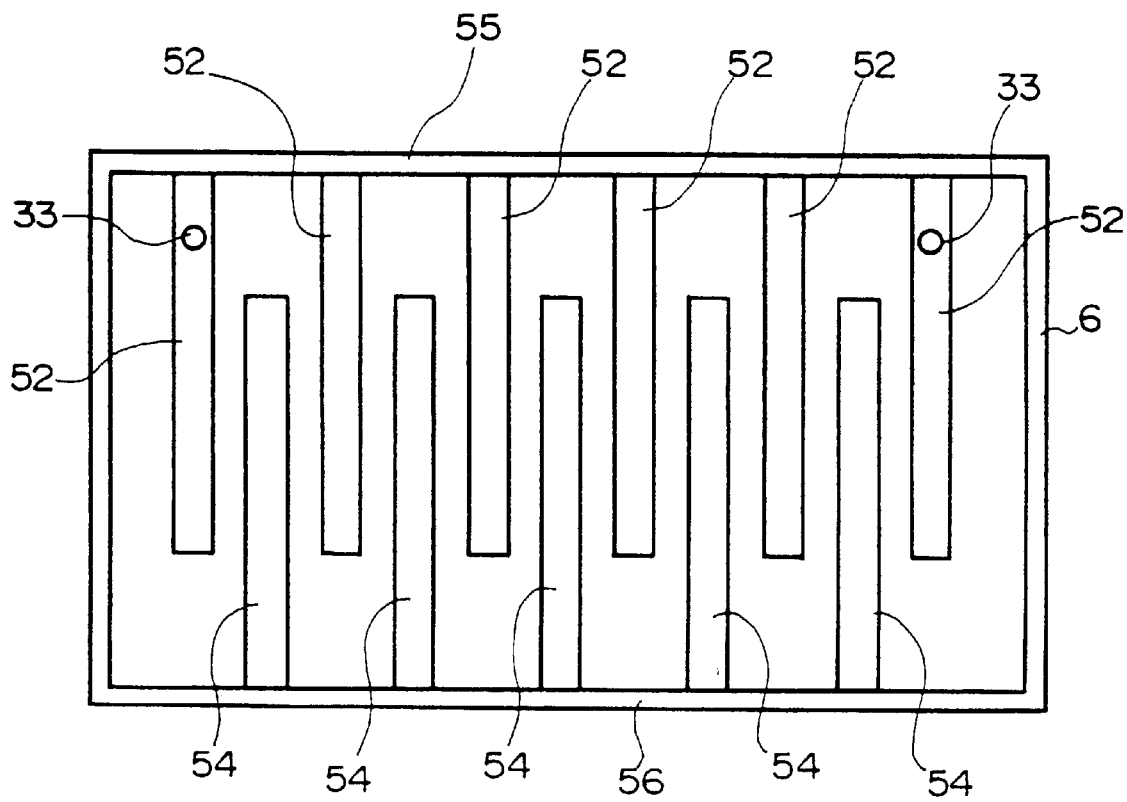
FIG. 8 is a schematic plane view of the plasma generator of the second embodiment of the invention.

The following description is about the plasma generator of the second mode of the present invention. FIG. 7 is a schematic sectional front view of the plasma generator of the second embodiment of the invention. FIG. 8 is a schematic plane view of the plasma generator of the second embodiment of the invention.

The antenna configuration in this embodiment is much different from that in the first embodiment. Specifically, the antenna in this embodiment is composed of two groups of antenna elements 52,54 which are provided alternately and in parallel with each other.

More specifically, shield 6 is used commonly as an antenna holder which holds each group of antenna elements 52,54 at its each side wall. The left side wall of shield 6 holds the first group of antenna elements 52 which are arrayed and elongated in one direction in parallel and the right side wall of shield 6 holds the second group of antenna elements 54 which are arrayed and elongated in the opposite direction in parallel. Each antenna element 54 of the second group is located at the intermediate positions between neighboring every two antenna elements 52 of the first group.

Each end of antenna elements 52 of the first group is disconnected with the right side wall and each end of antenna elements 54 of the second group is also disconnected with the left side wall. The length of each antenna elements 52,54 corresponds to one-fourth of the wavelength of the RF to be applied.

An inter-digital filter is composed of the antenna in this embodiment as well as the antenna in the described first embodiment. Specifically, as shown in FIG. 7 and FIG. 8, a coaxial cables 33 connect a RF source (not shown) and both outermost antenna elements 52, with which the RF is initially applied. If the frequency of the applied RF corresponds sufficiently to a resonant frequency of the inter-digital filter which depends on such factors as the intrinsic reactance of antenna elements 52,54 and the floating capacitance between neighboring two antenna elements 52,54, the RF is coupled with every neighboring two antenna elements 52,54 to be propagated, such that the RF is resonant at and radiated from every antenna element 52,54 uniformly.

In the apparatus of the second embodiment, there is high probability of electrons losing their energy by collision with the side wall of plasma generation chamber 1. As a result, they follow the induced electric field, because the longitudinal direction of each antenna element 52,54 intersects with the side wall, as in the first embodiment. In contrast to the prior art apparatus, therefore, there is a low probability of high-energy electron production. This contributes to the generation of the high-energy and low-electron-temperature plasma.

The electric distance d between antenna elements 52,54 and the shield in the second embodiment is also sufficiently less than the electric distance $(t_1+t_2/\epsilon_S)$ between antenna elements 52,54 and the plasma so that the temporarily and spatially stable plasma can be generated by sufficiently reducing the influence of the unstable floating capacitance between the antenna elements 52,54 and the plasma.

Figure 9:
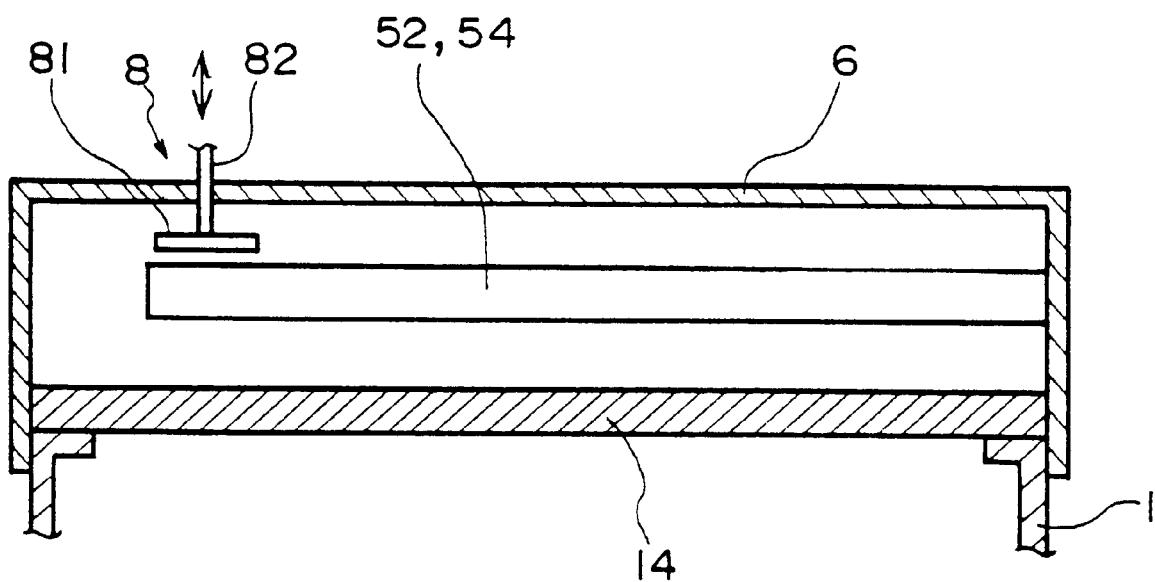
FIG. 9 is a schematic sectional side view showing the principal composition of the plasma generator of the third embodiment of the invention.

Following is the description about the plasma generator of the third embodiment which is composed by modifying the second embodiment. FIG. 9 is a schematic sectional side view showing the principal composition of the plasma generator of the third embodiment.

In the plasma generator of the third embodiment, capacitance adjusters 8 which adjust the floating capacitance between antenna elements 52,54 and shield 6 are provided in addition to the arrangement of the described second embodiment. Each capacitance adjuster 8 is composed of a metal plate 81 located above the end portion of each antenna element 52,54 and a holder pole 82 which holds metal plate 81 so as to lift up and down metal plate 81.

Holder pole 82 is movable up and down and penetrates shield 6, being short-circuited with shield 6. Therefore, metal plate 81 held by holder pole 82 is the earth potential. When metal plate 81 is lifted up or down by moving holder pole 82, the distance between antenna element 52,54 and shield 6 is changed, which enables the floating capacitance between antenna element 52,54 and shield 6 to vary. Therefore, the floating capacitance between antenna element 52,54 and shield 6 can be adjusted freely.

A preferred example using capacitance adjuster 6 is to make the resonant electric distance of antenna elements 52,54 changeable without changing the geometric length of them. As described, the resonant electric length l of antenna elements 52,54 is $(2n+1)/\{4f\sqrt{(LC)}\}$. Therefore, the electric length l can be changed without changing the geometric length by varying the reactance of antenna elements 52,54.

A practical way is to increase the floating capacitance by adding capacitance adjuster 8, giving a value smaller than the resonant electric length with the geometric length of the antenna elements 52,54. The electric length l is coordinated so that it corresponds to $(2n+1)/\{4f\sqrt{(LC)}\}$ by moving holder pole 82 to adjust the amount of the floating capacitance. This makes the RF resonant at the given frequency f, even if the geometric length is short of the electric length l. This is because, in many cases the geometric length of antenna elements 52,54 is limited according to conditions such as the width of the antenna provision space and the size of the plasma generating area, and such capacitance correction is very profitable.

Other than that, capacitance adjuster 8 can be used to correct a subtle difference of the inductive reactance among antenna elements 52,54 for establishing the resonant condition. In any event, using capacitance adjuster 8 optimizes the operation of the inter-digital filter. Of course, a similar capacitance adjuster can be employed with each antenna element 52,54 described in the first and second embodiments.

The described composition of each embodiment can be modified as follows. First of all, not only a part but all of plasma generation chamber 1 can be made of dielectric material. Only the part locating at the path for introducing the RF has to be dielectric. As a frequency of the RF to apply, any frequency other than 500 MHz can be employed as long as it can generate an inductively coupled-plasma.

In the composition of the invention, the antenna is not limited to a radiation type and may have any configuration as long as an antenna element elongated vertically with the direction for the plasma in plasma generation chamber 1 is used. Therefore, many kinds of antennas such as dipole antennas, array antennas or unipole antennas can be employed.

In composition of the invention, antenna elements 52,54 do not need to compose a filter such as an inter-digital filter and may compose a simple antenna such as a T-type dipole antenna. Even in such a composition a problem that the RF propagation becomes unstable if the floating capacitance between antenna element 52,54 and the plasma becomes unstable can arise. Therefore, the arrangement where the electric distance between antenna element 52,54 and shield 6 is less than that between antenna element 52,54 and the plasma effectively prevents this problem.

Although the composition where shield 6 covers the antenna has the effect that the RF is not radiated in unnecessary directions, occasionally shield 6 does not need to cover the antenna completely. For example, in the case where the antenna has a strong orientation only for the axial direction and has little orientation for directions vertical to the axis, the side wall of shield 6 is not necessary.

What is claimed is:

1. A plasma generator, comprising:

a plasma generation chamber which is pumped to a vacuum pressure and into which plasma generation gas is introduced;

an antenna provided outside said plasma generation chamber;

a RF source which supplies a RF power of a frequency with said antenna to excite said antenna, wherein a part or whole of said plasma generation chamber is made of dielectric having relative permittivity $\epsilon_S$, said antenna can radiate the RF to induce the RF field in said plasma generation chamber through said dielectric of said plasma generation chamber and is comprised of multiple antenna elements which longitudinal direction are on a plane vertical to the direction for the plasma in said plasma generation chamber; and a shield at the opposite side of said plasma generation chamber interposing said antenna, and, the electric distance between said antenna and said shield is shorter than the length made from adding $1/\epsilon_S$ times of the thickness of said dielectric of said plasma generation chamber with the distance between said dielectric and said antenna.

2. The plasma generator of claim 1, wherein said multiple antenna elements are provided so that the RF power is coupled with neighboring every two antenna elements at the frequency, composing an inter-digital filter of the RF radiated into said plasma generation chamber.

3. The plasma generator of claim 2, wherein said multiple antenna elements are divided into a first group, which are held by a center antenna holder provided coaxially with said plasma generation chamber and which are elongated vertically from said center antenna holder and apart at an equal angle from each other making a radial configuration, and a second group, which are held by an outer antenna holder provided coaxially with said center antenna holder to surround said antenna elements of the first group and which are elongated from said outer antenna holder for the center of said plasma generation chamber at the intermediate positions between neighboring every two antenna elements of the first group; and, further comprising an inter-digital filter comprised of an arrangement where each end of said antenna elements of the first group is disconnected with said outer antenna holder, each end of the antenna elements of the second group is disconnected with said center antenna holder, and, said antenna elements of the first and second group have the resonant electric length at the frequency of the RF to apply.

4. The plasma generator of claim 3, further comprising a capacitance adjuster which adjusts the floating capacitance between said antenna element and said shield to vary the electric length of said antenna element.

5. The plasma generator of claim 2, wherein said antenna elements are divided into a first group, which are arrayed in parallel with each other and held by a first antenna holder, and a second group, which are arrayed in parallel with each other at the intermediate positions between neighboring every two antenna elements of the first group; and further comprising an inter-digital filter comprised of an arrangement where each end of said antenna elements of the first group is disconnected with a second antenna holder, each end of said antenna elements of the second group is disconnected with said first antenna holder, and, said antenna elements of the first and second group have the resonant electric length at the frequency of the RF to apply.

6. The plasma generator of claim 5, further comprising a capacitance adjuster which adjusts the floating capacitance between said antenna element and said shield to vary the electric length of said antenna element.

7. The surface treatment apparatus using the plasma generator of claim 1, comprising a substrate holder for placing a substrate in said plasma generation chamber or another chamber communicating with said plasma generation chamber, wherein said substrate holder holds said substrate so that the substrate surface to be treated is parallel to the longitudinal direction of said antenna elements, and, the substrate surface is treated utilizing a plasma generated in said plasma generation chamber.

8. The surface treatment apparatus of claim 7, wherein said surface treatment is a plasma chemical vapor deposition.

9. The surface treatment apparatus of claim 7, wherein said surface treatment is a plasma etching.

10. The surface treatment apparatus of claim 8, wherein said surface treatment is $SiO_2/Si$ selective etching.

* * * * *